(12) United States Patent
Daido et al.

(10) Patent No.: US 6,222,135 B1
(45) Date of Patent: Apr. 24, 2001

(54) CIRCUIT BOARD FOR PREVENTING SOLDER FAILURES

(75) Inventors: Yukiko Daido, Kusatsu; Yoshihisa Hatta, Shiga-ken, both of (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/176,653

(22) Filed: Oct. 21, 1998

(30) Foreign Application Priority Data

Oct. 30, 1997 (JP) .................................................. 9-298092

(51) Int. Cl.$^7$ ........................................................ H05K 1/02
(52) U.S. Cl. ........................ 174/250; 174/254; 174/260; 361/749
(58) Field of Search .................................... 174/250, 254, 174/260; 228/180.1, 180.21; 361/748, 749, 760; 257/666, 668; 428/209, 901

(56) References Cited

U.S. PATENT DOCUMENTS 5,661,086 * 8/1997 Nakashima et al. ................ 257/668
5,842,275 * 12/1998 McMillan, II et al. ..... 228/180.21 X

FOREIGN PATENT DOCUMENTS

| 4-59172 | 5/1992 | (JP) . | |
|---|---|---|---|
| 4-372134 | * 12/1992 | (JP) | ..................................... 174/250 |
| 5-28072 | 4/1993 | (JP) . | |
| 5-226792 | 5/1993 | (JP) . | |
| 06029631 | 2/1994 | (JP) . | |

\* cited by examiner

Primary Examiner—Hyung Sub Sough
(74) Attorney, Agent, or Firm—Lawrence R. Fraley

(57) ABSTRACT

A circuit board (10) on which surface electronic components (15) are mounted during a reflow process comprises a circuit portion (12), a surrounding circumferential portion (13) and at least one elongated opening (14) formed in the surrounding circumferential portion substantially parallel to the direction the board travels during the reflow direction (16) to prevent electronic component soldering failures that may occur as a result of the deflection of the circuit board flow process.

5 Claims, 3 Drawing Sheets

CIRCUIT BOARD FOR PREVENTING SOLDER FAILURES

TECHNICAL FIELD

The present invention relates to printed circuit boards and particularly to a circuit board on the surface of which electronic components are mounted using solder reflow processing.

BACKGROUND OF THE INVENTION

Various computing apparatuses (e.g., notebook computers) for which miniaturization is a continuing design objective typically utilize electronic components of a surface mounting type which are mounted on the apparatus circuit board(s) at the highest density possible in order to reduce the circuit board's required real estate.

Solder reflow for soldering electronic components onto a printed circuit board is a known and widely used process. During reflow, the circuit board may be bent (e.g., upwardly) due to exposure to the heat generated during the reflow process, or it may be downwardly bent due to said heat and the weight of the electronic components mounted thereon. As a result, unacceptable gaps may form between the circuit board and the electronic components mounted thereon to the extent that electronic component and circuit board solder failures result. The board must then be scrapped or subjected to extensive rework, both relatively costly to the board manufacturer and component assembler.

A printed circuit board apparently designed to reduce bending of the circuit board during a reflow process is described in Japanese Unexamined Patent Publication No. Hei 5-226792. FIG. 1 of the present drawings is a view of this printed circuit board. Specifically, a printed circuit board 1 has perforations 2 formed within its surface, the perforations 2 defining a circuit board portion 3 on which electronic components are to be mounted. Surrounding board portion 3 is an edge portion 4. Multiple tiny openings (slits) 5 formed in surrounding portion 4 are substantially perpendicular to the direction (6) in which the printed circuit board is transported during the reflow process.

The circuit board of FIG. 1 is effective because during the reflow process, the tiny elongated openings 5 formed in surrounding portion 4 help to reduce the bending of the circuit board in the feeding direction (6). A conventional circuit board, not having such slits, is not as effective in reducing such board deflection in said direction.

It is believed that a printed circuit board that prevents solder failures between components and connection pads thereon in a new and unique manner in comparison to the approach described in the foregoing Japanese publication would represent a significant advancement in the art.

DISCLOSURE OF THE INVENTION

It is, therefore, a primary object of the present invention to enhance the printed circuit board art.

It is another object of the invention to provide a printed circuit board which can be effectively produced on a large scale without harm to solder connections between the board's circuitry and the leads of components coupled thereto.

It is a more particular object of the invention to provide a new board design which substantially prevents solder disconnections caused by board deflection during processing, especially during solder reflow.

In accordance with one aspect of the invention, there is provided a printed circuit board adapted for having electronic components mounted thereon by a solder reflow process, the board comprising a circuit portion having an electrical circuit thereon, a circumferential portion substantially surrounding the circuit board, and at least one elongated opening formed within the surrounding circumferential portion substantially parallel to the predetermined direction the printed circuit board moves during the solder reflow process to substantially prevent electronic component solder failures that occur as a result of the deflection of the printed circuit board during the reflow process.

BEST MODE FOR CARRYING OUT THE INVENTION

For a better understanding of the present invention, together with other and further objects, advantages and capabilities thereof, reference is made to the following disclosure and appended claims in connection with the above-described drawings.

Figure 1:
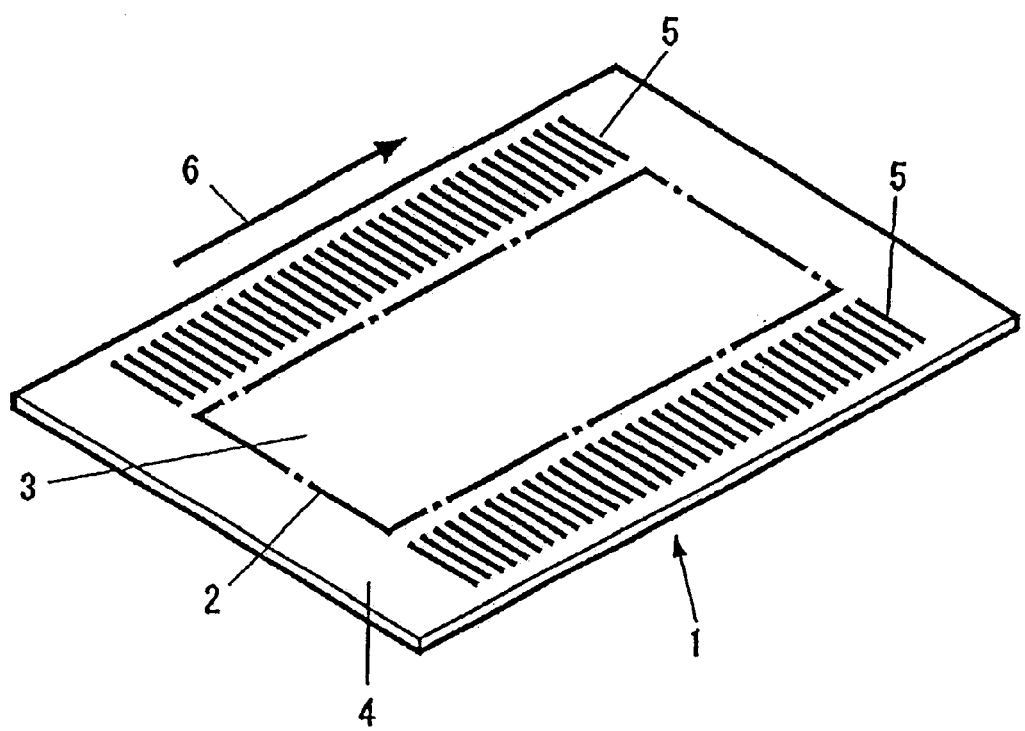
FIG. 1 is a perspective view illustrating a conventional printed circuit board.
Figure 2:
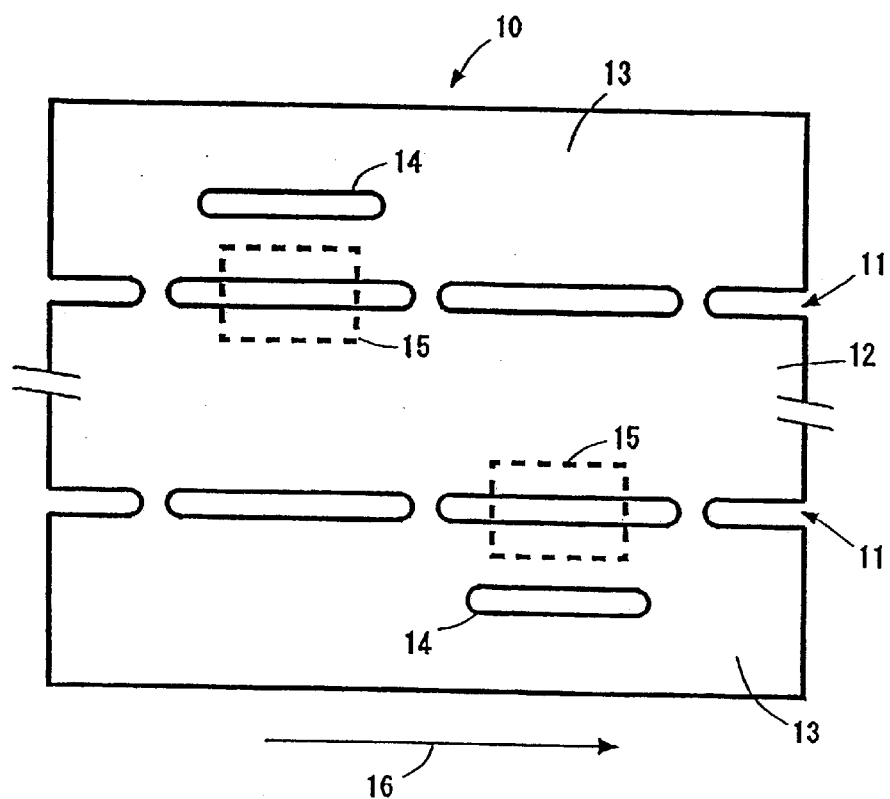
FIG. 2 is a plan view, on an enlarged scale over the view in FIG. 1, illustrating a printed circuit board according to one aspect of the present invention.

FIG. 2 is a drawing illustrating a printed circuit board 10 according to one embodiment of the present invention. As shown, printed circuit board 10 has a plurality of perforations 11 formed therein in two linear patterns substantially parallel to one another. Perforations 11 serve to define a central circuit portion 12 designed for mounting electronic components thereon, and two adjacent circumferential portions 13. Portions 13 are understood to be formed along the outer portions (periphery) of board 10 and may lie on opposite sides of circuit portion 12 as well as completely surround portion 12 (e.g., in FIG. 2, portion 13 may also extend along both right and left sides of the board). Broken lines 15 indicate two spaced-apart electronic components (e.g., connectors) which are soldered in position on board 10 so as to overlap the central circuit portion 12 and the adjacent portions 13. Openings 14 are formed in the circumferential portions 13 prior to positioning of electronic components 15. Although only one elongated opening (slot) 14 is formed for each electronic component 15, a plurality of elongated openings may be formed in parallel for each respective component.

Figure 3:
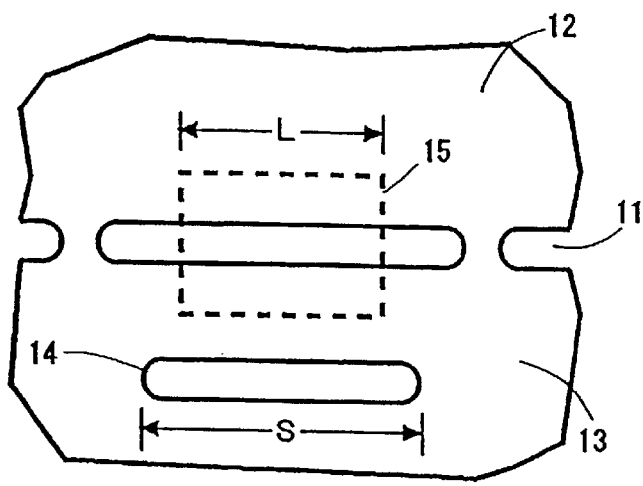
FIG. 3 is a partial, plan view, enlarged over the view of FIG. 2, showing the slotted (opening) portion of the printed circuit board of the present invention in FIG. 2.

FIG. 3 is an enlarged view of a part of the board in FIG. 2, illustrating in greater detail the relationship between the electronic component and associated elongated opening 14 of the printed circuit board of the present invention. Opening 14 is formed substantially parallel to the electronic component 15, which is positioned in the reflow direction (16, FIG. 2.) and which overlaps the circuit portion 12 and the surrounding portion 13. Length "S" of opening 14 is equal to or greater than the length "L" of the corresponding electronic component 15. Note also that component 15 is oriented directly over an underlying perforation 11, this perforation being longer than both the component and adjacent opening 14. As seen in FIG. 3, the widths of both perforation 11 and opening 14 are substantially the same. Opening 14 is thus parallel to the board's direction of travel 16.

Figure 4:
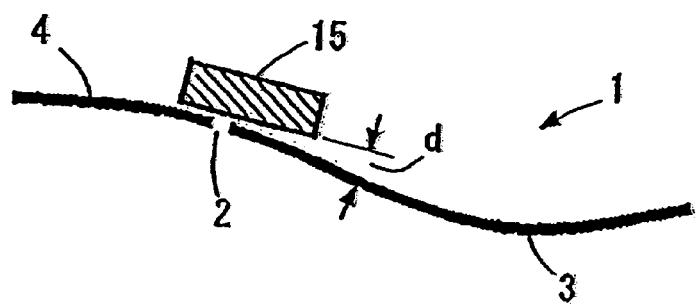
FIGS. 4(a) and 4(b) are comparative views, showing the reduced deflection of the printed circuit board of the present invention.
Figure 4:
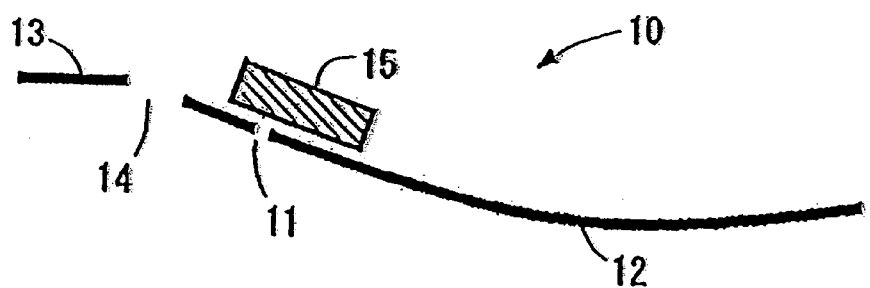

FIGS. 4(a) and 4(b) explain how the deflection, perpendicular to the feeding direction, of the printed circuit board 10 of the present invention can be reduced during the reflow process. FIG. 4(a) shows the deflection of a conventional printed circuit board during a typical reflow process, while FIG. 4(b) illustrates the deflection of the printed circuit board 10 of the present invention during the same reflow process. Clearly, the relative spacing between the electronic components (15) and underlying board surface is significantly reduced in FIG. 4(b) wherein the component remains substantially parallel to the immediate underlying surface.

For the printed circuit board 1 in FIG. 4(a), during the reflow process, board deflection occurs substantially perpendicular to the direction in which the circuit board travels during the reflow process. This deflection occurs substantially at the location of perforations 2. Therefore, when an electronic component 15 (e.g., a connector) is positioned so that it overlaps the board's circuit portion 3 and surrounding portion 4, a gap "d", which may exceed the acceptable tolerance spacing level between circuit and component, is formed between the circuit board and one end of the positioned electronic component 15 from deflection perpendicular to the board's direction of travel. As a result, one or more of the component's lead terminals at said end portion are raised (and possibly separated from) the corresponding contact pads on the circuit board. Solder failures thus occur.

In comparison, for the printed circuit board 10 of the present invention (FIGS. 2, 3 and 4(b)), it is understood that during the solder reflow process, deflection of the circuit board occurs in the vicinity of opening(s) 14. Thus, when the electronic component 15 is positioned so that it overlaps the board's circuit portion 12 and surrounding portion 13, a gap exceeding acceptable tolerances is not formed between the circuit board 10 and similar end of the electronic component 15. This resulting orientation of the component is shown in FIG. 4(b), the component substantially parallel to the immediately underlying board surface. As a result, solder failure at the corresponding end of the electronic component 15 is substantially prevented.

While there have been shown and described what are at present the preferred embodiments of the invention, it will be obvious to those skilled in the art that various changes and modifications may be made therein without departing from the scope of the invention as defined by the appended claims.

What is claimed is:

1. A printed circuit board adapted for having surface electronic components soldered thereon during a solder reflow process wherein said printed circuit board moves in a predetermined direction during said solder reflow process, said printed circuit board comprising:

a circuit portion having an electrical circuit thereon;

a circumferential portion substantially surrounding said circuit portion;

at least one elongated opening formed within said surrounding circumferential portion to be substantially parallel to said predetermined direction said printed circuit board moves during said solder reflow process to substantially prevent electronic component solder failures that occur as a result of the deflection of said printed circuit board during said reflow process;

said circuit portion including at least one elongated perforation located therein adjacent and substantially parallel to said elongated opening in said surrounding circumferential portion; and an electronic component having a length dimension and positioned on said board so as to be oriented directly over said at least one elongated perforation within said circuit portion, said electronic component overlapping both said circuit portion and said surrounding circumferential portion, said at least one elongated opening positioned substantially parallel to said length dimension of said electronic component.

2. The printed circuit board according to claim 1, wherein the length of said elongated opening is greater than said length dimension of said electronic component.

3. The printed circuit board according to claim 1 wherein said elongated perforation includes a length dimension substantially longer than said length dimension of said electronic component and the length of said elongated opening.

4. The printed circuit board according to claim 3 wherein the lengths of both said at least one elongated opening and said at least one elongated perforation are greater than said length dimension of said electronic component.

5. The printed circuit board according to claim 4 wherein said at least one elongated opening and said at least one elongated perforation are of substantially the same width.

* * * * *